United States Patent
Ma et al.

(10) Patent No.: US 10,510,692 B2
(45) Date of Patent: Dec. 17, 2019

(54) SEMICONDUCTOR DEVICE INCLUDING DUMMY CONDUCTIVE CELLS

(71) Applicant: TAIWAN SEMICONDUCTOR MANUFACTURING CO., LTD., Hsinchu (TW)

(72) Inventors: Wei-Yu Ma, Taitung (TW); Hui-Mei Chou, Zhudong Township (TW); Kuo-Ji Chen, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/046,449

(22) Filed: Jul. 26, 2018

(65) Prior Publication Data

US 2018/0337145 A1  Nov. 22, 2018

Related U.S. Application Data

(62) Division of application No. 14/062,845, filed on Oct. 24, 2013, now Pat. No. 10,043,767.

(51) Int. Cl.
| | |
|---|---|
| *H01L 23/52* | (2006.01) |
| *H01L 23/58* | (2006.01) |
| *H01L 23/528* | (2006.01) |
| *H01L 23/522* | (2006.01) |
| *H01L 27/02* | (2006.01) |

(52) U.S. Cl.
CPC ........ *H01L 23/585* (2013.01); *H01L 23/522* (2013.01); *H01L 23/5286* (2013.01); *H01L 27/0207* (2013.01); *H01L 2924/0002* (2013.01)

(58) Field of Classification Search
CPC ......... H01L 27/11573; H01L 27/11575; H01L 27/0207; H01L 27/222; H01L 23/522; G11C 7/14
USPC ................. 257/210, 211, 260, 261, 691, 758
See application file for complete search history.

(56) References Cited

U.S. PATENT DOCUMENTS

| | | |
|---|---|---|
| 7,470,630 B1 | 12/2008 | Chen et al. |
| 7,574,685 B1 | 8/2009 | Dong et al. |
| 9,299,450 B1 * | 3/2016 | Pang ................. G11C 16/3427 |
| 10,297,330 B2 * | 5/2019 | Zhang ............... G11C 16/3459 |
| 10,381,339 B1 * | 8/2019 | Wang ..................... H01L 22/14 |
| 2002/0063335 A1 | 5/2002 | Ozawa et al. |
| 2002/0093849 A1 * | 7/2002 | Hidaka ................... G11C 11/15 |
| | | 365/158 |
| 2004/0088669 A1 | 5/2004 | Loh et al. |
| 2005/0110146 A1 | 5/2005 | Wang |
| 2006/0166434 A1 | 7/2006 | Kinoshita et al. |
| 2007/0222077 A1 | 9/2007 | Ogihara et al. |
| 2007/0272949 A1 | 11/2007 | Shinomiya et al. |

(Continued)

*Primary Examiner* — S. V. Clark
(74) *Attorney, Agent, or Firm* — Maschoff Brennan

(57) ABSTRACT

A semiconductor device includes metal layers, first dummy conductive cells, and groups of second dummy conductive cells. The metal layers include empty areas and are grouped into pairs of neighboring metal layers. The first dummy conductive cells are each formed in each of the empty areas in each of the pairs of neighboring metal layers that is overlapped by another empty area or a line in the same pair of neighboring metal layers. Each group of the second dummy conductive cells is formed in each of the empty areas in each of the pairs of neighboring metal layers that is overlapped by a signal line in the same pair of neighboring metal layer.

20 Claims, 5 Drawing Sheets

(56) References Cited

U.S. PATENT DOCUMENTS

2009/0055792 A1 2/2009 Itagaki
2019/0189632 A1* 6/2019 Lee .................. H01L 27/11575

* cited by examiner

SEMICONDUCTOR DEVICE INCLUDING DUMMY CONDUCTIVE CELLS

RELATED APPLICATIONS

The present application is a divisional application of the U.S. application Ser. No. 14/062,845, filed Oct. 24, 2013, now patent Ser. No. 10/043,767, issued Aug. 7, 2018, all of which are herein incorporated by reference.

BACKGROUND

In semiconductor chips having low power and high performance, there are more and more power domains. If noise immunity in power lines and ground lines is not good enough, the integral signal communication cannot be guaranteed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
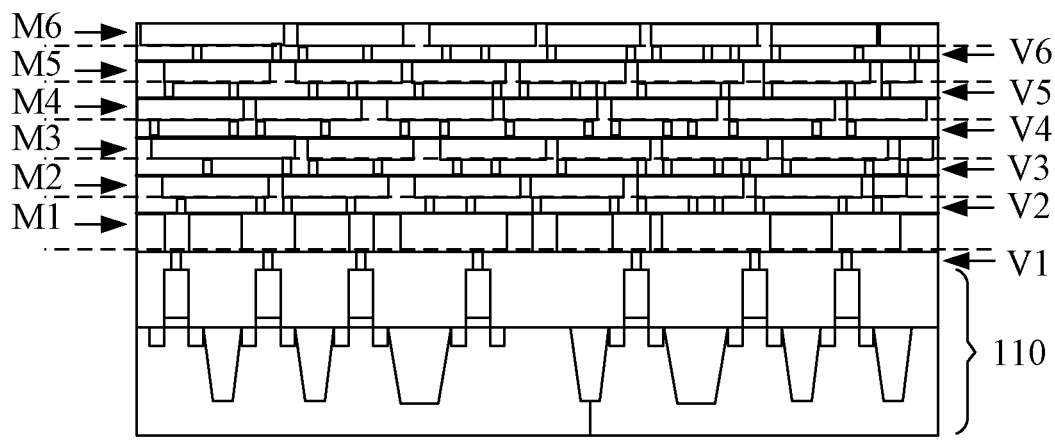
FIG. 1 is a schematic diagram of a semiconductor device in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

In this document, the term "coupled" may also be termed as "electrically coupled", and the term "connected" may be termed as "electrically connected". "Coupled" and "connected" may also be used to indicate that two or more elements cooperate or interact with each other.

FIG. 1 is a schematic diagram of a semiconductor device 100 in accordance with various embodiments of the present disclosure. The semiconductor device 100 includes a device portion 110, metal layers M1-M6 and via layers V1-V6.

In some embodiments, the metal layers M1-M6 are formed on the device portion 110 and are electrically connected to the device portion 110. The metal layers M1-M6 include metal lines (not labeled) to connect different IC components in the device portion 110 together. The via layers V1-V6 connects different metal lines in different metal layers M1M6.

For illustration in FIG. 1, the metal layers M1-M6 include six layers that are labeled as M1, M2, M3, M4, M5 and M6 respectively. In some embodiments, the metal layers M1-M6 are grouped into pairs of neighboring metal layers, e.g., M1/M2, M3/M4 and M5/M6.

Figure 2:
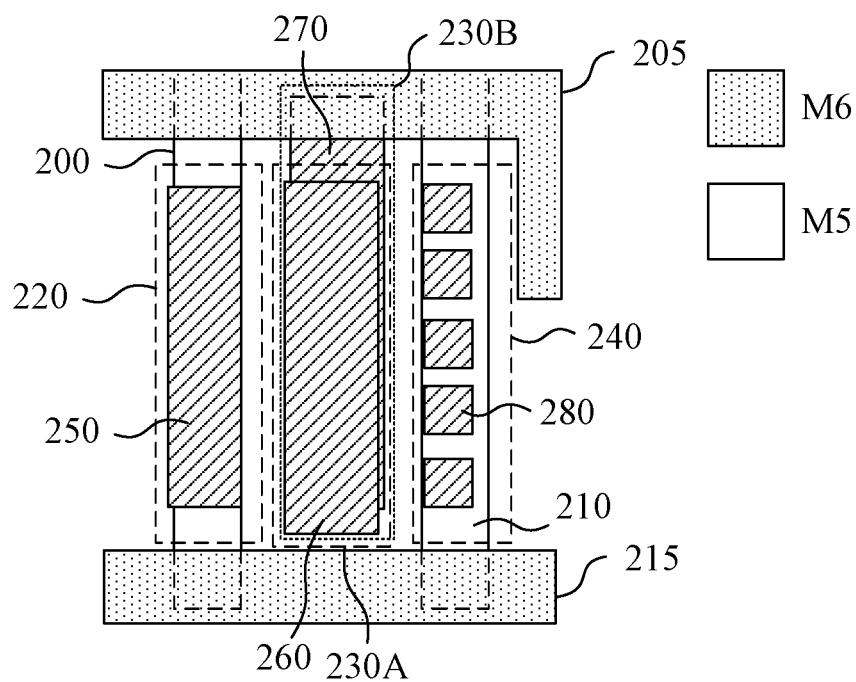
FIG. 2 is an exemplary diagram of a top view of the pair of neighboring metal layers in accordance with various embodiments of the present disclosure.

FIG. 2 is an exemplary diagram of a top view of the pair of neighboring metal layers M5 and M6 in accordance with various embodiments of the present disclosure.

For illustration in FIG. 2, a line 200 and a signal line 210 are presented in the metal layer M5. In some embodiments, the line 200 is either a power line or a ground line. Two signal lines 205 and 215 are presented in the metal layer M6.

In some embodiments, empty areas 220, 230A, 230B and 240 are the areas in each of the metal layers M5 and M6 that have no metal line passing through. Therefore, the empty area 220 is presented in metal layer M6 and is overlapped by the line 200 in metal layer M5. The empty area 230A enclosed by the dash line frame in FIG. 3B, is presented in metal layers M6. The empty area 230B enclosed by the dot line frame in FIG. 3B, is presented in metal layers M5. The empty area 230A and the empty area 230B are two overlapped empty areas. The empty area 240 is presented in metal layer M6 and is overlapped by the signal line 210 in metal layer M5.

A dummy conductive cell 250 is formed in the empty area 220 and overlaps the line 200. Two dummy conductive cells 260 and 270 are formed in the empty areas 230A and 230B in metal layers M6 and M5. In some embodiments, the empty area 230B in metal layer M5 extends longer than the empty area 230A in metal layer M6, and the dummy conductive cell 270 is formed larger than the dummy conductive cell 260. A group of dummy conductive cells 280 are formed in the empty area 240 in metal layer M6 and overlap the signal line 210.

In some embodiments, the area of each of the dummy conductive cells 280 is smaller and is separated to not fully cover the empty area 240. As a result, the group of dummy conductive cells 280 provides a density less than the density of the dummy conductive cells 250-270. Explained in a different way, the ratio between the total areas of the group of dummy conductive cells 280 and the empty area 240 is less than the ratio between the total areas of, for example, the dummy conductive cell 250 and the empty area 220.

In some embodiments, the material of the dummy conductive cells 250-280 includes metal. Effectively, each of the dummy conductive cells 250-280 forms a capacitor with either an overlapped metal line for transmitting power/signal or another overlapped dummy conductive cell in the neighboring metal layer. As a result, the dummy conductive cells 250-280 provide a decoupling effect to further provide noise immunity to the overlapped metal line such as the line 200 and the signal line 210.

Effectively, the dummy conductive cell 250 has a greater density and provides a greater decoupling effect to guarantee good noise immunity of the line 200 to ensure integral signal communication. The dummy conductive cells 260 and 270 not only provide a uniformity of the semiconductor device 100 illustrated in FIG. 1 when the overlapped empty areas 230A and 230B are presented in two neighboring layers M5 and M6, but also provide a greater decoupling effect to guarantee good noise immunity among the metal lines neighboring to the empty areas 230A and 230B. Moreover, the dummy conductive cell 280 having less density provides a lighter decoupling effect to provide noise immunity to the signal line 210 without interfering the signal transmission therein.

By forming the dummy conductive cells 250-280, the dummy conductive cells 250-280 provide a decoupling effect to guarantee good noise immunity of the metal lines in the metal layers M5 and M6. At the same time, the uniformity of the semiconductor device 100 is maintained after chemical-mechanical polishing (CMP) process. The process yield is thus enhanced. As a result, the capacitance in the metal layers M5 and M6 is increased to commit the chip power/ground integrity with an enhanced process yield. No additional area is needed to dispose additional capacitors.

In some embodiments, the dummy conductive cells are formed in other metal layers M1-M4 in FIG. 1 too. Various configurations of the dummy conductive cells and the metal lines in different metal layers M1-M4 are within the contemplated scope of the present disclosure.

In some embodiments, when there are metal layers in the semiconductor device 100 that are not paired with other metal layers, the dummy conductive cells of the larger density are formed in the empty areas in these metal layers.

The formation of dummy conductive cells is exemplarily illustrated below.

FIGS. 3A-3D are top views of the pair of neighboring metal layers M5 and M6 in different stages of the formation of the dummy conductive cells 250-280 in accordance with various embodiments of the present disclosure.

Figure 4:
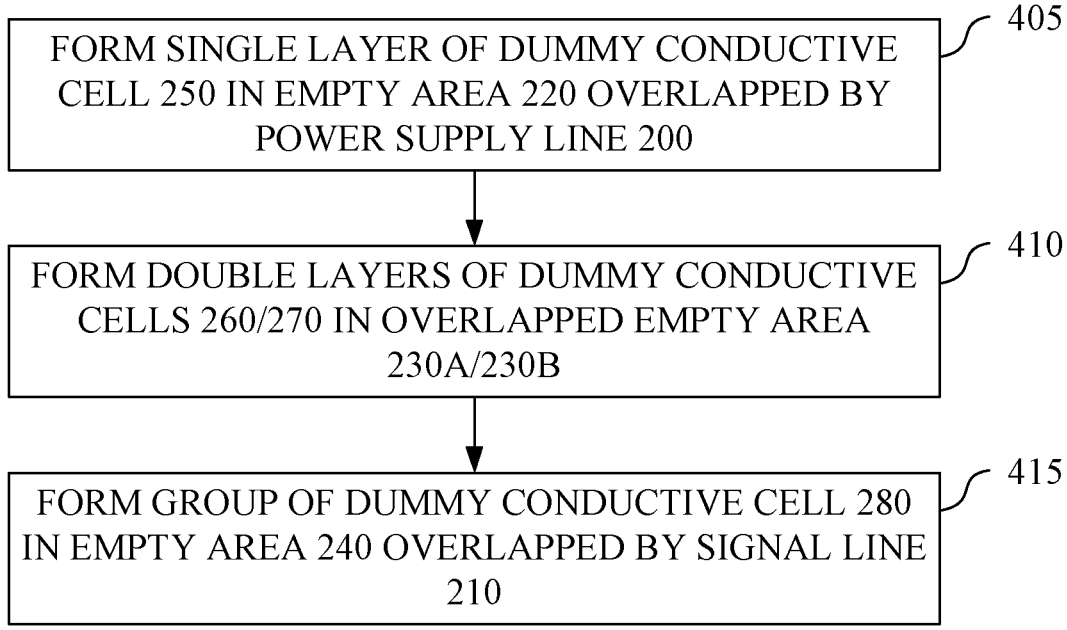
FIG. 4 is a flow chart of a method illustrating the process of forming the dummy conductive cells in the metal layers in FIG. 2, in accordance with various embodiments of the present disclosure.

FIG. 4 is a flow chart of a method 400 illustrating the process of forming the dummy conductive cells 250-280 in the metal layers M5 and M6 in FIG. 2, in accordance with various embodiments of the present disclosure.

For illustration, the formation of the dummy conductive cells 250-280 in FIG. 2 is described by the method 400 with reference to FIG. 3A-3D.

Figure 3A:
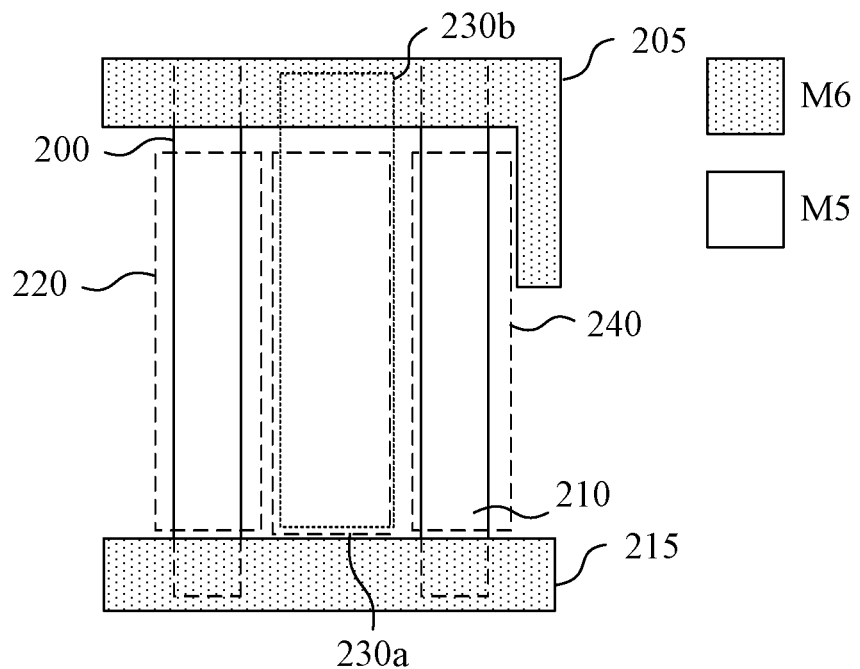
FIGS. 3A-3D are top views of the pair of neighboring metal layers in different stages of the formation of the dummy conductive cells in accordance with various embodiments of the present disclosure.
Figure 3B:
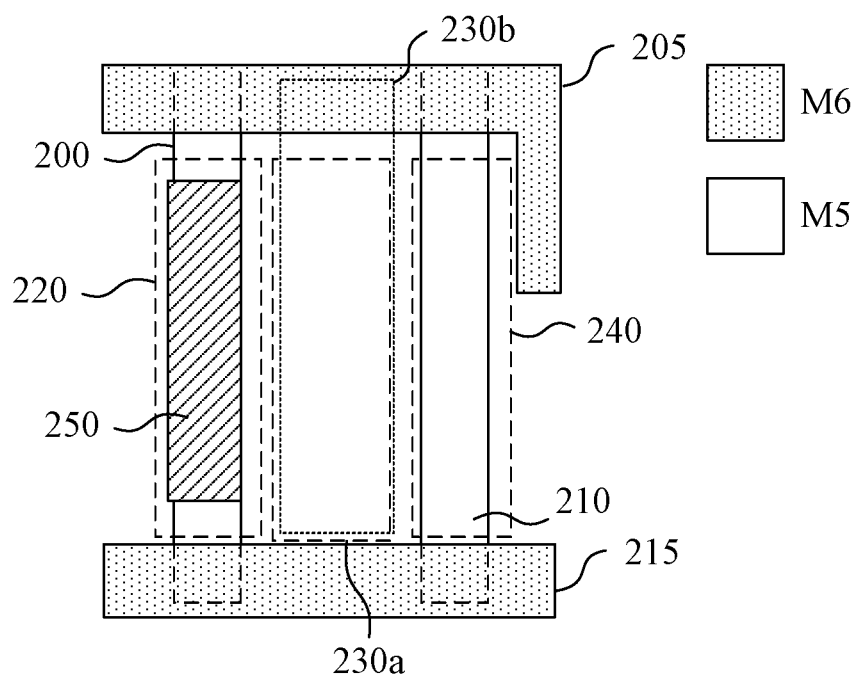

As shown in FIG. 3A, the metal layers M5 and M6 include empty areas 220, 230A, 230B and 240.

In operation 405, a single layer of the dummy conductive cell 250 is formed in the empty area 220, as illustrated in FIG. 3B, in which the overlap condition of the empty area 220 indicates that the empty area 220 is overlapped by the line 200 in the neighboring metal layer M5.

Figure 3C:
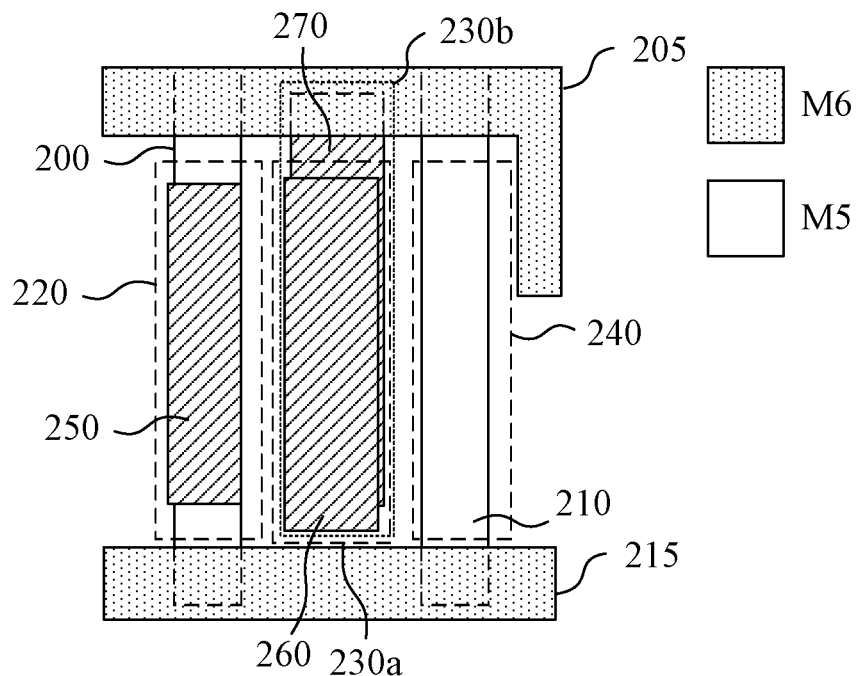

In operation 410, double layers of the dummy conductive cells 260 and 270 are formed in the two overlapped empty areas 230A and 230B respectively, as illustrated in FIG. 3C, in which the overlap conditions of the two empty areas 230A and 230B indicates that the empty areas 230A and 230B are two overlapped empty areas in two neighboring metal layers M5 and M6.

Figure 3D:
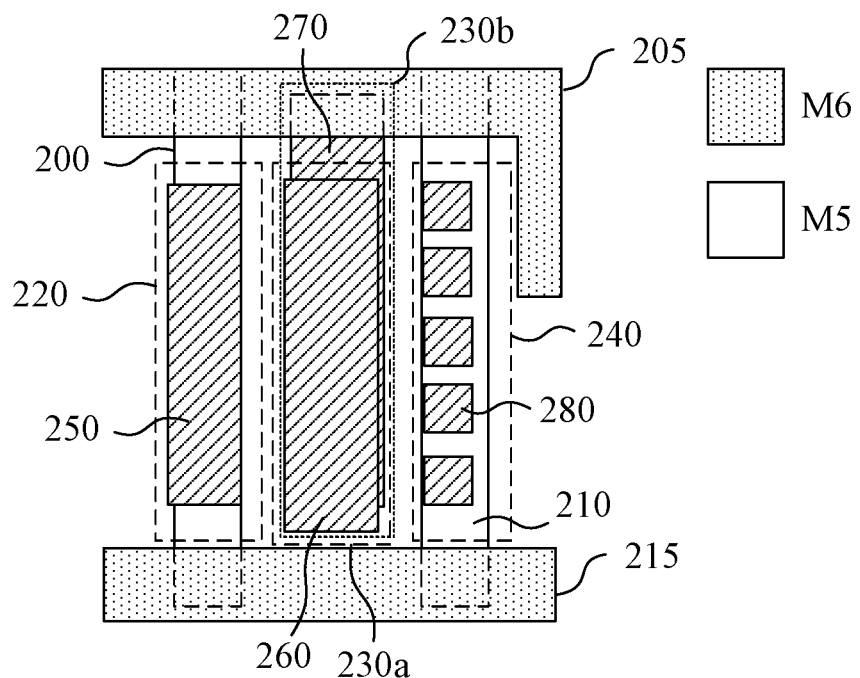

In operation 415, a group of independent dummy conductive cells 280 are formed in the empty area 240, as illustrated in FIG. 3D, in which the overlap conditions of the empty area 240 indicates that the empty area 240 is overlapped by the signal line 210 in the neighboring metal layer M5.

The configuration of metal layers M5 and M6 including the dummy conductive cells 250-280 is illustrated in FIG. 2.

In some embodiments, the dummy conductive cells in other pairs of neighboring metal layers such as M1/M2 and M3/M4 are formed by using the operations 405-415. Various configurations depend on the configurations of empty layers and metal lines in these pairs of neighboring metal layers.

Figure 5:
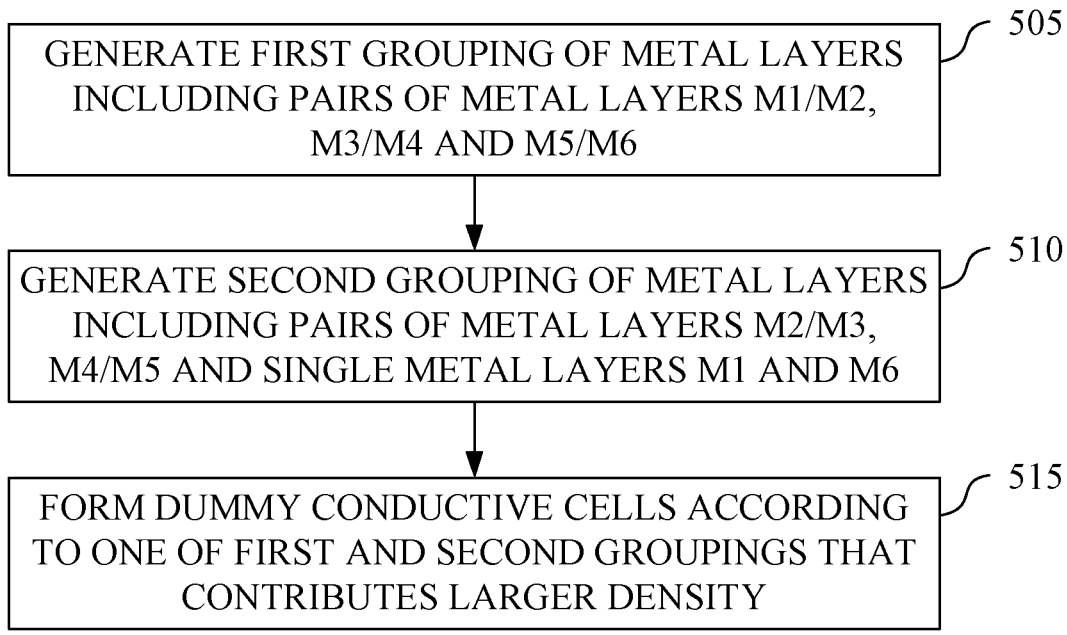
FIG. 5 is a flow chart of a method illustrating the process of forming the dummy conductive cells in the metal layers in FIG. 1, in accordance with various embodiments of the present disclosure.

FIG. 5 is a flow chart of a method 500 illustrating the process of forming the dummy conductive cells in the metal layers M1-M6 in FIG. 1, in accordance with some embodiments of the present disclosure.

In operation 505, a first grouping of the metal layers, that includes the pairs of metal layers M1/M2, M3/M4 and M5/M6, is generated.

In operation 510, a second grouping of the metal layers, that includes the pairs of metal layers M2/M3, M4/M5 and two single metal layers M1 and M6, is generated.

In operation 515, forming the dummy conductive cells according to one of the first grouping and the second grouping that has the overlap conditions contributing a larger density.

In some embodiments, the dummy conductive cells are formed by using the operations 405-415 illustrated in FIG. 4.

Based on the operations 505, 510 and 515, the empty areas in the metal layers M1-M6 of the semiconductor device 100 in different groups are evaluated. The dummy conductive cells are formed according to the evaluation result to accomplish the largest density to provide a better uniformity and noise immunity to the metal layers M1-M6.

Figure 6:
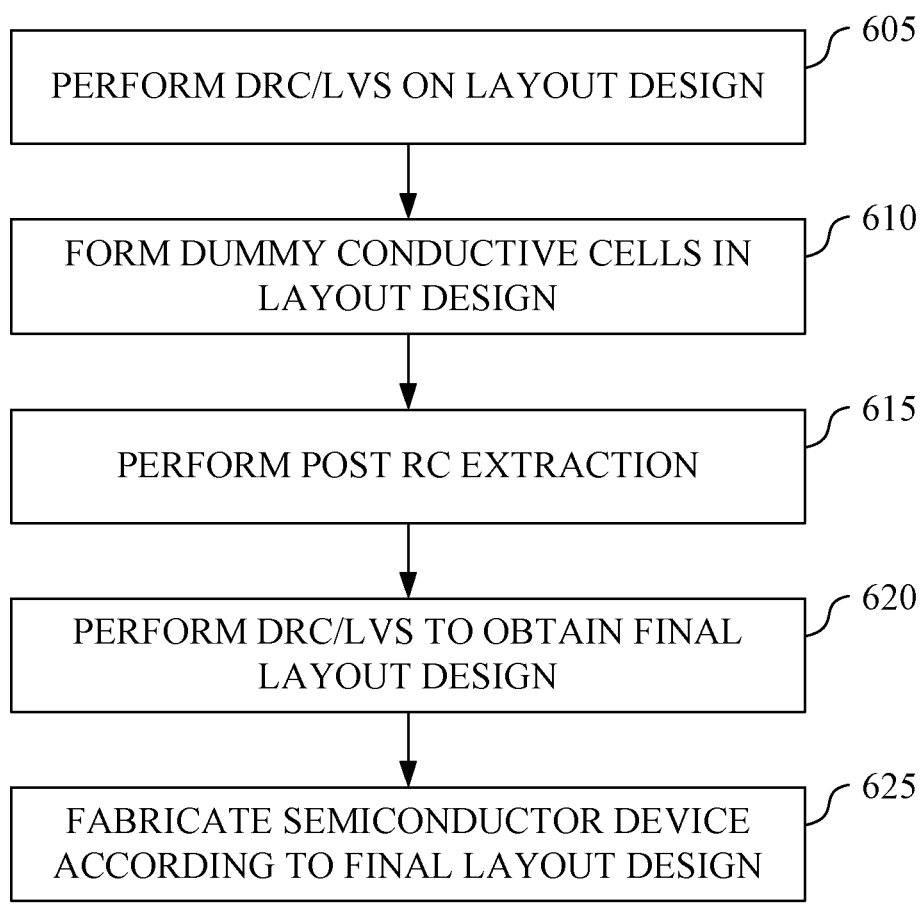
FIG. 6 is a flow chart of a method illustrating the process of forming the dummy conductive cells to the semiconductor device in FIG. 1, in accordance with various embodiments of the present disclosure.

FIG. 6 is a flow chart of a method 600 illustrating the process of forming the dummy conductive cells in the semiconductor device 100 in FIG. 1, in accordance with some embodiments of the present disclosure.

In operation 605, a verification process including the design rule check (DRC) and the layout versus schematic (LVS) is performed on a layout design of the semiconductor device 100. In some embodiments, the layout design of the semiconductor device 100 includes only the device portion 110 and the metal layers M1-M6. Further, the layout design of the semiconductor device 100 is formed by an auto place and route (APR) tool.

In operation 610, the dummy conductive cells in the metal layers M1-M4 are formed in the layout design of the semiconductor device 100 to generate a graphic data system (GDS) file. In some embodiments, the dummy conductive cells are formed by using the operations 305-315 illustrated in FIG. 3 and the operations 405, 410, and 415 illustrated in FIG. 4.

In some embodiments, after the generation of the GDS file, a Milky/LEF file is generated subsequently to allow the APR tool to read the file and perform the chip implantation flow to connect the dummy conductive cells. In some embodiments, pins are added on these dummy conductive cells such that the APR tool is able to identify the dummy conductive cells to perform the chip implantation flow.

In some embodiments, after the generation of the GDS file, the connection of the dummy conductive cells is performed manually.

In operation 615, a post RC (resistor and capacitor) extraction is performed on the layout design including the dummy conductive cells.

In operation 620, another verification process including the DRC and the LVS is performed again to obtain a final layout design of the semiconductor device 100.

In operation 625, the semiconductor device 100 is fabricated according to the final layout design.

Based on the aforementioned operations, the empty areas in the metal layers M1-M6 are analyzed during the design stage of the semiconductor device 100. The overlap conditions of the empty areas with the neighboring layers are thus determined. Subsequently, the dummy conductive cells with different densities are formed according to the overlap conditions during the fabrication process to provide the uniformity and the noise immunity to the metal layers M1-M6.

In some embodiment, a semiconductor device includes metal layers, first dummy conductive cells, and groups of second dummy conductive cells. The metal layers include empty areas and are grouped into pairs of neighboring metal layers. The first dummy conductive cells are each formed in each of the empty areas in each of the pairs of neighboring metal layers that is overlapped by another empty area or a line in the same pair of neighboring metal layers. Each group of the second dummy conductive cells is formed in each of the empty areas in each of the pairs of neighboring metal layers that is overlapped by a signal line in the same pair of neighboring metal layer.

Also disclosed is a semiconductor device that includes metal layers including empty areas, and a group of first dummy conductive cells that are separate from each other and vertically overlap a signal line, in a first single empty area of the empty areas. The signal line is formed in a first metal layer in a pair of neighboring metal layers of the metal layers, and the group of dummy conductive cells that vertically overlap the signal line are formed in a second metal layer in the same pair of neighboring metal layers. When viewed in plan view, projection areas of the group of dummy conductive cells are vertically overlapped by a projection area of the signal line.

Also disclosed is a method that includes forming dummy conductive cells that provides different densities in empty areas in metal layers of a semiconductor device according to overlap conditions of the empty areas each arranged between a pair of neighboring metal layers of the metal layers. Forming the dummy conductive cells includes forming a group of dummy conductive cells in a single empty area of the empty areas when the single empty area in one pair of the neighboring metal layers is overlapped by a signal line in the same pair of the neighboring metal layers. When viewed in plan view, projection areas of the group of dummy conductive cells are vertically overlapped by a projection area of the signal line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a plurality of metal layers comprising a plurality of empty areas and grouped into a plurality pairs of neighboring metal layers;
   a plurality of first dummy conductive cells each formed in each of the empty areas in each of the plurality pairs of neighboring metal layers that is overlapped by another empty area or a line in the same pair of neighboring metal layers; and
   a plurality groups of second dummy conductive cells, wherein each group of the second dummy conductive cells is formed in each of the empty areas in each of the plurality pairs of neighboring metal layers that is overlapped by a signal line in the same pair of neighboring metal layer.

2. The semiconductor device of claim 1, wherein a material of the first and the second dummy conductive cells comprise metal.

3. The semiconductor device of claim 1, wherein the line is a power line or a ground line.

4. The semiconductor device of claim 1, wherein each of the groups of second dummy conductive cells provides a density less than that of each of the first dummy conductive cell.

5. The semiconductor device of claim 1, further comprising a device portion, wherein the metal layers are formed on the device portion and electrically connected to the device portion.

6. The semiconductor device of claim 1, wherein the pairs of neighboring metal layers are grouped according to one of a first grouping and a second grouping that has overlap conditions of the empty areas contributing a larger density, wherein the first grouping is generated by grouping each pair of neighboring metal layers from a top metal layer of the plurality of metal layers and the second grouping is generated by grouping each pair of neighboring metal layers from one of the metal layers that is under the top metal layer.

7. A semiconductor device comprising:
   a plurality of metal layers comprising empty areas; and
   a group of first dummy conductive cells that are separate from each other and vertically overlap a signal line, in a first single empty area of the empty areas, wherein the signal line is formed in a first metal layer in a pair of neighboring metal layers of the plurality of metal layers, and the group of first dummy conductive cells that vertically overlap the signal line are formed in a second metal layer in the same pair of neighboring metal layers;

wherein, when viewed in plan view, projection areas of the group of first dummy conductive cells are vertically overlapped by a projection area of the signal line.

8. The semiconductor device of claim 7, further comprising:
a second dummy conductive cell different from the group of first dummy conductive cells, the second dummy conductive cell vertically overlapping a power line or a ground line and arranged in a second single empty area of the empty areas.

9. The semiconductor device of claim 8, wherein a ratio of a total area of the group of first dummy conductive cells to the first single empty area is less than a ratio of an area of the second dummy conductive cell to the second single empty area.

10. The semiconductor device of claim 7, further comprising:
a pair of dummy conductive cells, different from the group of first dummy conductive cells, the pair of dummy conductive cells vertically overlapping each other and arranged in the empty areas of two neighboring metal layers, respectively, in the plurality of metal layers.

11. The semiconductor device of claim 10, wherein the group of first dummy conductive cells provides a density less than that of the pair of dummy conductive cells.

12. The semiconductor device of claim 10, wherein one of the pair of dummy conductive cells is larger than the other of the pair of dummy conductive cells.

13. The semiconductor device of claim 7, wherein material of the group of dummy conductive cells comprises metal.

14. A semiconductor device comprising:
a pair of metal layers comprising a first single empty area and a second single empty area;
a pair of first dummy conductive cells, wherein one of the pair of first dummy conductive cells is formed in the first single empty area and vertically overlaps the other one of the pair of first dummy conductive cells formed in the second single empty area; and
a group of second dummy conductive cells formed in the first single empty area and overlapping a signal line formed in a first metal layer of the pair of metal layers,
wherein the group of second dummy conductive cells are vertically overlapped by the signal line in a second metal layer of the pair of metal layers, and the group of second dummy conductive cells are separated from each other.

15. The semiconductor device of claim 14, further comprising:
a third dummy conductive cell formed in the first single empty area and vertically overlapped by a power line or a ground line formed in the pair of metal layers.

16. The semiconductor device of claim 15, wherein the group of second dummy conductive cells has a density less than that of the third dummy conductive cell.

17. The semiconductor device of claim 15, wherein a ratio of a total area of the group of second dummy conductive cells to the first single empty area is less than a ratio of an area of the third dummy conductive cell to the second single empty area.

18. The semiconductor device of claim 14, wherein one of the pair of first dummy conductive cells has an area greater than that of the other one of the pair of first dummy conductive cells in plan view.

19. The semiconductor device of claim 14, wherein the first single empty area is vertically between the second single empty area and one of the pair of metal layers.

20. The semiconductor device of claim 14, wherein the group of second dummy conductive cells forms a capacitor with the overlapped signal line.

* * * * *